United States Patent
Chang et al.

(10) Patent No.: US 8,039,935 B2
(45) Date of Patent: Oct. 18, 2011

(54) WAFER LEVEL CHIP SCALE PACKAGING STRUCTURE AND METHOD OF FABRICATING THE SAME

(75) Inventors: Shu-Ming Chang, Hsinchu (TW); Lee-Cheng Shen, Hsinchu (TW); Wei-Chung Lo, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 506 days.

(21) Appl. No.: 11/652,088

(22) Filed: Jan. 11, 2007

(65) Prior Publication Data

US 2007/0108629 A1    May 17, 2007

Related U.S. Application Data

(63) Continuation-in-part of application No. 10/765,961, filed on Jan. 29, 2004, now Pat. No. 6,998,718.

(51) Int. Cl.
*H01L 23/02* (2006.01)
(52) U.S. Cl. ............... 257/678; 257/734; 257/E23.021; 438/106
(58) Field of Classification Search .......... 438/106; 257/737, 773, E21.058, E23.021, 781, 678, 257/E21.068
See application file for complete search history.

(56) References Cited

U.S. PATENT DOCUMENTS

| | | |
|---|---|---|
| 4,948,456 A | 8/1990 | Schubert |
| 5,834,844 A | 11/1998 | Akagawa et al. |
| 5,925,931 A | 7/1999 | Yamamoto |
| 5,977,632 A * | 11/1999 | Beddingfield ............... 257/737 |
| 6,023,103 A | 2/2000 | Chang et al. |
| 6,277,669 B1 * | 8/2001 | Kung et al. ................... 438/106 |
| 6,407,459 B2 | 6/2002 | Kwon et al. |
| 6,441,487 B2 | 8/2002 | Elenius et al. |
| 6,555,908 B1 * | 4/2003 | Eichelberger et al. ........ 257/737 |
| 6,621,164 B2 | 9/2003 | Hwang et al. |
| 6,806,570 B1 | 10/2004 | Lee et al. |
| 6,818,544 B2 * | 11/2004 | Eichelberger et al. ........ 438/613 |
| 6,998,718 B2 | 2/2006 | Chang et al. |
| 2002/0100982 A1 * | 8/2002 | Kim et al. ..................... 257/773 |
| 2002/0127768 A1 | 9/2002 | Badir et al. |
| 2004/0043538 A1 * | 3/2004 | Lo et al. ........................ 438/117 |
| 2005/0104226 A1 * | 5/2005 | Chang et al. .................. 257/781 |

OTHER PUBLICATIONS

Hamano et al., "Super CSP™: WLCSP Solution for Memory and System LSI," International Symposium on Advanced Packaging Materials, 1999, pp. 221-225.
Kazama et al., "Development of Low-cost and Highly Reliable Wafer Process Package," Electronic Components and Technology Conference, 2001, 7 pages.

* cited by examiner

*Primary Examiner* — Matthew E Warren
*Assistant Examiner* — Fang-Xing Jiang
(74) *Attorney, Agent, or Firm* — Birch, Stewart, Kolasch and Birch, LLP

(57) ABSTRACT

A wafer level chip scale packaging structure and the method of fabricating the same are provided to form a sacrificial layer below the bump using a normal semiconductor process. The bump is used to connect the signals between the Si wafer and the PCB. The interface between the sacrificial layer and the adjacent layers is the weakest part in the whole structure. When the stress applied to the bump is overloaded, the interface between the sacrificial layer and the adjacent layers will crash to remove the stress generated by different thermal expansion coefficients of the Si wafer and the PCB. The sacrificial layer would help avoid the crash occurring to the bump to protect the electrical conduction between the Si wafer and the PCB.

7 Claims, 15 Drawing Sheets

WAFER LEVEL CHIP SCALE PACKAGING STRUCTURE AND METHOD OF FABRICATING THE SAME

CROSS REFERENCE TO RELATED APPLICATION

This is a continuation-in-part of Ser. No. 10/765,961, filed Jan. 29, 2004, now U.S. Pat. No. 6,998,718 entitled "WAFER LEVEL CHIP SCALE PACKAGING STRUCTURE AND METHOD OF FABRICATING THE SAME".

BACKGROUND OF THE INVENTION

1. Field of Invention

The invention relates to a wafer level chip scale packaging structure and the method of fabricating the same. In particular, the invention relates to a wafer level chip scale packaging structure that uses a specially designed sacrificial layer material to remove the stress generated due to differential thermal expansion coefficients between the silicon (Si) wafer and the printed circuit board (PCB).

2. Related Art

The wafer level chip scale packaging is a very important technique for the packaging of wafers and PCB. The main difference from the conventional flip chip in package technique is: as the thermal expansion coefficients between the wafer (Si) and the PCB material is very large, it is likely to have some cracks at the solder ball joints during the reliability test after the wafer is assembled.

Therefore, one usually includes an underfill step in the technique of flip chip in package to protect the solder ball joint from being damaged. However, the underfill step is very time-consuming and it is very hard to repair once the process is completed. Therefore, the wafer level chip scale packaging is developed to replace the conventional flip chip in package technique. Since this kind of wafer level chip scale packaging techniques has superior electrical performance and lower manufacturing costs than other packaging forms and belongs to re-workable packaging techniques, it will play an important role in the production of future electronics.

We describe the developed wafer level chip scale packaging techniques in the following paragraphs. FIG. 1 shows the packaging structure disclosed by the Japanese Hitachi, Ltd in Electronic Components and Technology Conference (p.40 to p.46) in 2001. This technique is used in the packaging of Si wafer 10 and organic PCB 20. Its main spirit is to put an extremely soft elastic layer 40 at the bottom of the solder ball 30. The elastic layer 40 releases the stress generated due to the differential thermal expansion coefficients between the Si wafer 10 and the organic PCB 20. However, there are not many choices suitable for the elastic layer 40. It has its technical bottleneck in manufacturing. Therefore, its applications are limited to the packaging of integrated circuits (IC) with a wide pitch (low number of pins).

FIG. 2 shows a chip-scale carrier for semiconductor devices including mounted spring contacts disclosed in the U.S. Pat. No. 6,023,103. The technique uses an elastic metal wire 50 as the channel connecting a Si wafer 10 and an organic PCB 20. Using the elasticity of the metal wire 50, the stress generated by the differential thermal expansion coefficients between the Si wafer 10 and the organic PCB 20 can be removed. However, the metal wire is formed by bonding. To enhance its strength, one has to employ a special process to strengthen the metal. This inevitably increases the manufacturing cost.

FIG. 3 shows the Super CSP structure proposed by Fujitsu, Ltd. The technique uses a semiconductor process to grow a copper post 60 of about 100 micrometer high as the electrical contact between the Si wafer 10 and the organic PCB 20. However, using this structure to alleviate the stress is not perfect. Moreover, to grow such a copper post 60 and to protect the copper from being oxidized will increase the cost. Therefore, it is not practical.

FIG. 4 shows the wafer level packaging structure disclosed in the U.S. Pat. Application No. 2002/0127768 A1. Its main technical feature is to form a vent hole 80 below a conductive bump 70. Using the vent hole 80 to replace the elastic layer 40 in FIG. 1 can obtain a better elastic effect. However, the vent hole 80 requires a special material and an accompanying fabricating process. Therefore, it has some limitation in mass production.

In considering the reliability of the products, most packaging techniques can be applied to IC elements with a small pin number (smaller than 100 I/O ports) and area and cannot be used for future IC elements with a large pin number and area.

Therefore, for an optimized packaging (such as wafer level packaging) of future electronic devices that have a larger pin number, many functions, and a large chip size (such as system of single chip or system packaging), it is imperative to find a method to minimize the manufacturing cost and the packaging volume/surface.

SUMMARY OF THE INVENTION

In view of the foregoing, an objective of the invention is to provide a wafer level packaging structure and the method of fabricating it. The invention uses the usual semiconductor process to form a sacrificial layer below the bump using a normal semiconductor process. The bump is used to connect the signals between the Si wafer and the PCB. The interface between the sacrificial layer and the adjacent layers or the sacrificial layer material is the weakest part in the whole structure. When the stress applied to the bump is overloaded, the interface between the sacrificial layer and the adjacent layers or the sacrificial layer material will crash to remove the stress generated by different thermal expansion coefficients of the Si wafer and the PCB. The sacrificial layer can help avoid the crash occurring to the bump to protect the electrical conduction between the Si wafer and the PCB.

In one embodiment of the invention, a wafer level packaging structure includes a substrate; an insulating layer formed on the substrate, wherein the insulating layer has a pad formed therein; a sacrificial layer formed on the insulating layer; and a metal wire formed on the insulating layer and the sacrificial layer, wherein one side of the metal wire contacts the pad, and the other side of the metal wire contacts the sacrificial layer.

According to the embodiment, the wafer level packaging structure further includes a bump formed at a position corresponding to the sacrificial layer on the metal wire.

According to the embodiment, the wafer level packaging structure further includes an insulating layer formed on the metal wire, wherein the insulating layer has a space formed at a position corresponding to the sacrificial layer; and a bump formed in the space of the insulating layer.

In one embodiment of the invention, a wafer level packaging structure includes a substrate; an insulating layer formed on the substrate, wherein the insulating layer has a pad formed therein; a first metal wire formed on the pad; a sacrificial layer formed on the first metal wire; a second metal wire formed on the sacrificial layer; and a connecting metal wire formed at one side of the sacrificial layer to connect with the first metal wire and the second metal wire.

According to the embodiment, the wafer level packaging structure further includes a bump formed at a position corresponding to the sacrificial layer on the second metal wire.

According to the embodiment, the wafer level packaging structure further includes an insulating layer formed on the second metal wire, wherein the insulating layer has a space formed at a position corresponding to the sacrificial layer; and a bump formed in the space of the insulating layer.

According to the embodiment, the wafer level packaging structure further includes a first insulating layer formed between the sacrificial layer and the first metal wire; a second insulating layer formed on the second metal wire and the connecting metal wire, wherein the second insulating layer has a space formed at a position corresponding to the sacrificial layer; and a bump formed in the space of the second insulating layer.

Since the wafer level packaging structure is fabricated using mature semiconductor processes, the structure and method can be used for mass production.

Further scope of the applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and constitute a part of this specification, illustrate embodiments of the invention and together with the description serve to explain the principles of the invention. In the drawings.

DETAILED DESCRIPTION OF THE INVENTION

Figure 1:
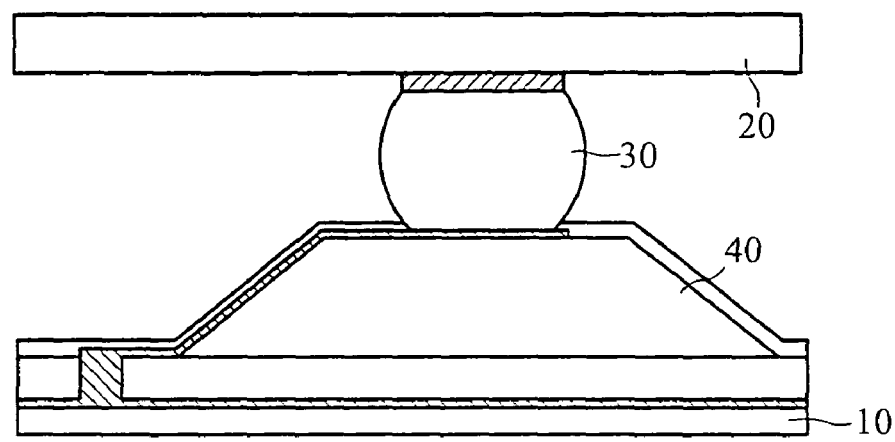
FIG. 1 is a schematic view of the conventional packaging structure that utilizes an elastic layer to release the stress generated by the differential thermal expansion coefficients between the Si wafer and the PCB.
Figure 2:
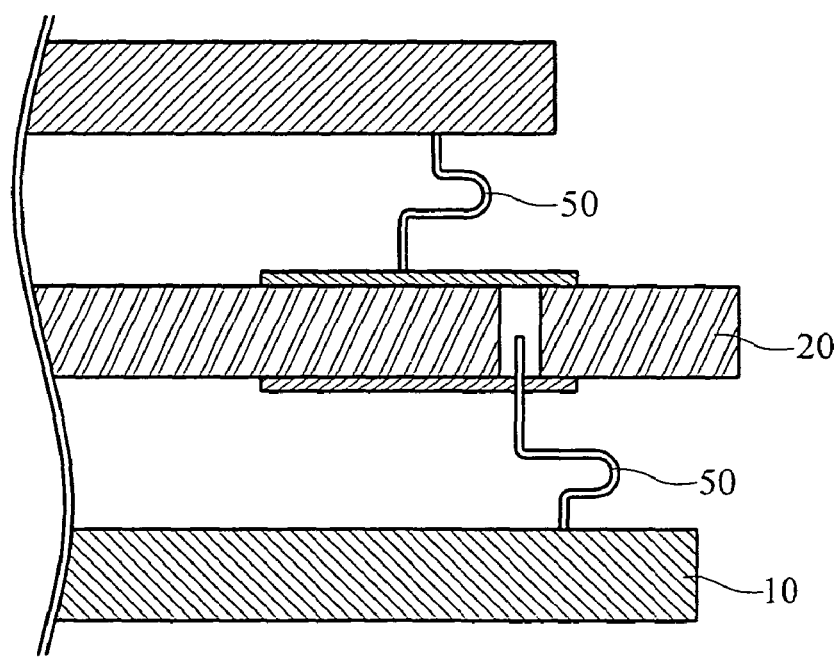
FIG. 2 is a schematic view of the conventional wafer level carrier structure for semiconductor devices.
Figure 3:
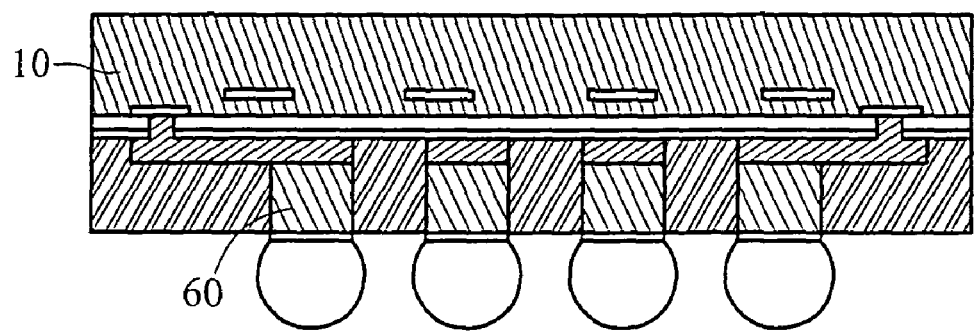
FIG. 3 is a schematic view of the Super CSP structure proposed by Fujitsu, Ltd.
Figure 4:
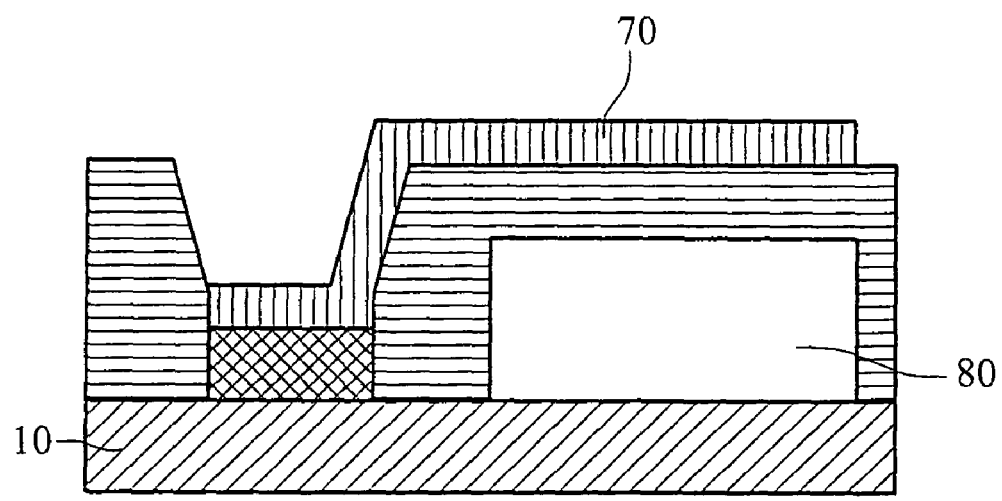
FIG. 4 is a schematic view of the wafer level packaging structure disclosed by the U.S. Pat. Application No. 2002/0127768 A1.

Reference will now be made in greater detail to a preferred embodiment of the invention, an example of which is illustrated in the accompanying drawings. Wherever possible, the same reference numerals are used throughout the drawings and the description to refer to the same or like parts. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 5:
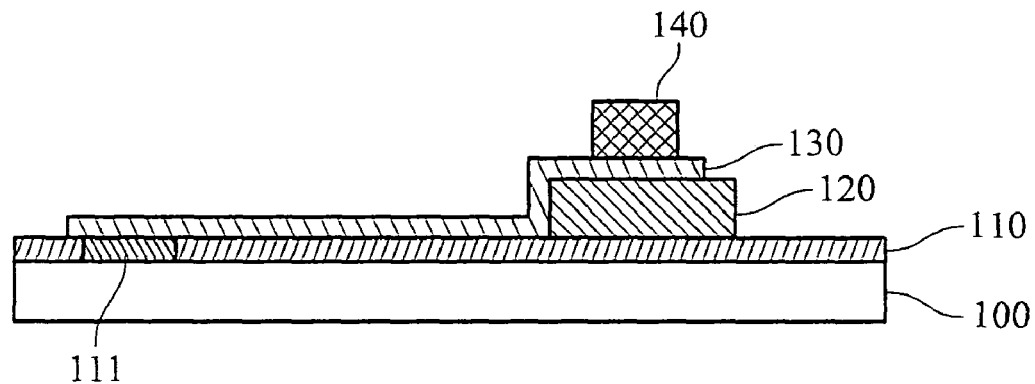
FIG. 5 is a cross-sectional view of the packaging according to the first embodiment.

Refer to FIG. 5 illustrating the cross-sectional views of the packaging structure according to the first embodiment of the invention.

The packing structure includes a substrate 100, an insulating layer 110, a sacrificial layer 120 and a metal wire 130. A bump 140 formed on the metal wire 130 is used as a metal contact for electrical connection between the substrate 100 and a PCB (not show).

In an exemplary embodiment, the substrate 100 is a Si wafer. After forming the required circuit layout on the substrate 100 using semiconductor processes, external signals can enter through the pads 111 on the surface of the substrate 100 to control the operations of the substrate 100. In the embodiment, the metal wire 130 directly contacts the sacrificial layer 120. An insulating layer is not necessary to be provided between the sacrificial layer 120 and the metal wire 130. In another exemplary embodiment, the substrate 100 is a printed circuit board, or a flexible printed circuit board.

The sacrificial layer 120 formed between the insulating layer 110 and the metal wire 130. The position is right below the bump 140. The metal wire 130 is pulled from the pads 111 to above the sacrificial layer 120 using the circuit RDL technique. The bump 140 is formed at a position on the metal wire 130 above the sacrificial layer 120 to electrically connect the pad 111. The substrate 100 and the PCB thereabove are thus in electrical communications.

The connection part of the sacrificial layer 120 and the insulating layer 110 or the interface between the sacrificial layer 120 and the metal wire 130 is weakest in the interfacial adhesive force or in the material of the structure. Therefore, when the stress on the bump 140 is too large, the connection part between the insulating layer 110 and the sacrificial layer 120 or the connection part between the sacrificial layer 120 and the metal wire 130 will break to release the stress between the substrate 100 and the PCB 130 while still keeping the electrical connection between the pads 111 on the substrate 90 and the bump 140. In another embodiment, the material of the sacrificial layer 120 may be adequately selected such that the sacrificial layer 120 may break to release the stress.

The material of the sacrificial layer 120 can be metals, epoxy, organic polymers, inorganic oxides, etc, as long as the interfacial adhesive force with the substrate 100 or the sacrificial layer material has the weakest mechanical strength in the complete structure.

Figure 6:
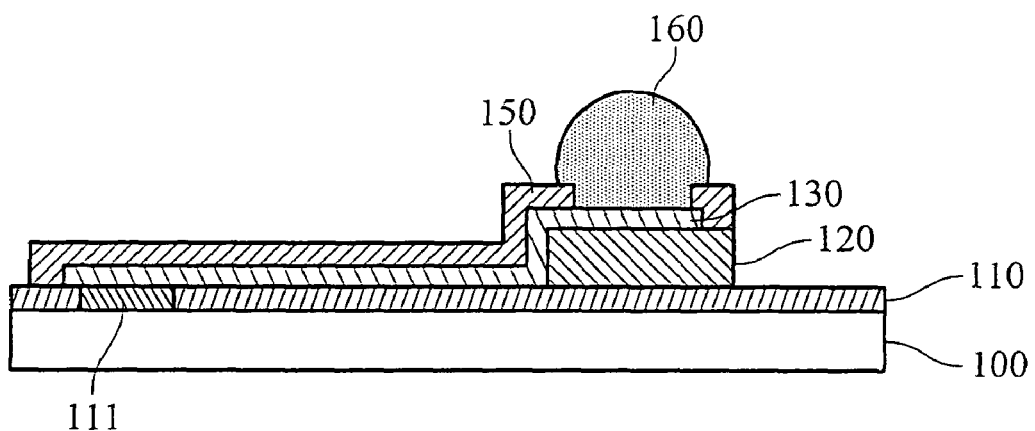
FIG. 6 is a cross-sectional view of the packaging according to the second embodiment.

Refer to FIG. 6 illustrating the cross-sectional views of the packaging structure according to the second embodiment of the invention. The elements having the same/similar reference numbers as/with those in FIG. 5 operates the same/similar function as/with those in FIG. 5. In this embodiment, a solder ball 160 used for the metal contact between the substrate 100 and the printed circuit board is formed on the metal wire 130. A passivation layer 150 is formed above the metal wire 130 to protect the substrate 100 and the packaging structure from being damaged. In an exemplary embodiment, the substrate 100 is a Si wafer. In another exemplary embodiment, the substrate 100 is a printed circuit board, or a flexible printed circuit board. It is appreciated that the metal contact may be the form of a solder ball and a bump by the embodiments respectively illustrated in FIGS. 5 and 6. Although FIG. 6 uses a solder ball as a metal contact, the solder ball in FIG. 6 and hereinafter is substantially a form of a bump.

Figure 7A:
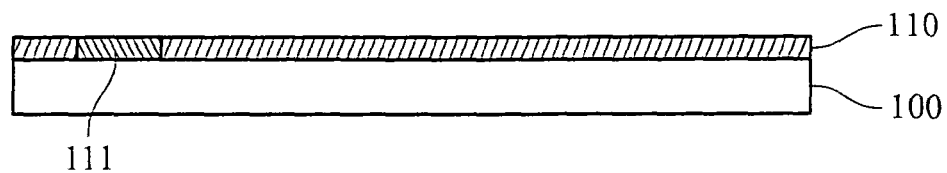
FIG. 7A to 7D illustrates the fabricating process for the first embodiment of the invention.
Figure 7B:
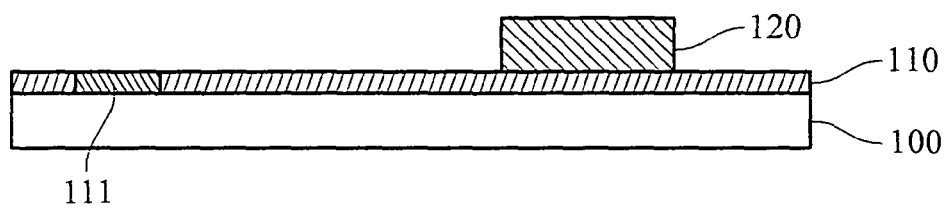

FIG. 7A to 7D illustrates the fabricating process for the first embodiment of the invention. As shown in FIG. 7A, an insulating layer 110 and a pad 111 are formed on the substrate 100. In one embodiment, the insulating layer 110 is formed first and then a portion is etched to deposit material to form the pad 111. In another embodiment, the pad 111 is formed first and then the insulting layer 110 is deposited on the substrate 100. As shown in FIG. 7B, a sacrificial layer 120 is formed at a position on the substrate 100 corresponding to the position of the bump 140 to be formed.

Figure 7C:
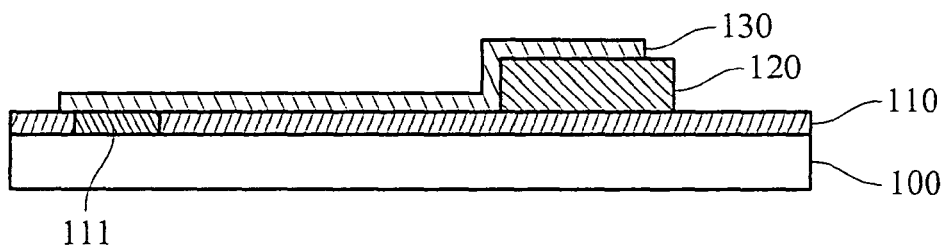

As shown in FIG. 7C, a metal wire 130 is formed on the substrate 100 and the sacrificial layer 120. One end of the metal wire 130 is connected to the pad 111 and the other end of the metal wire 130 is connected to the sacrificial layer 120 and corresponds to the position of the bump 140.

Figure 7D:
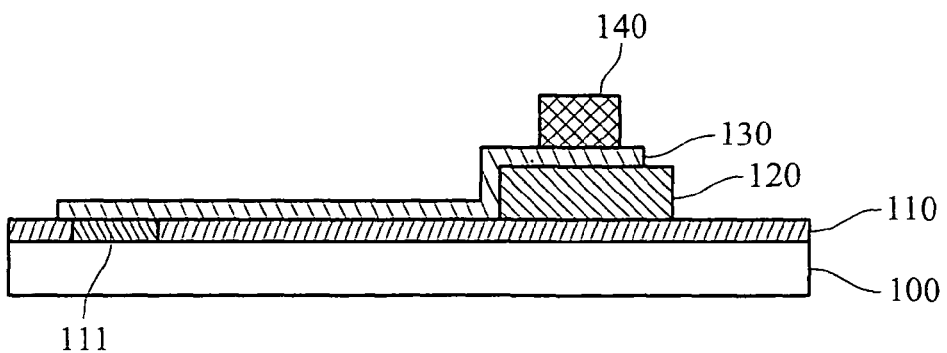

As shown in FIG. 7D, a bump 140 is formed at the position on the metal wire 130 corresponds to the sacrificial layer 120.

Figure 7E:
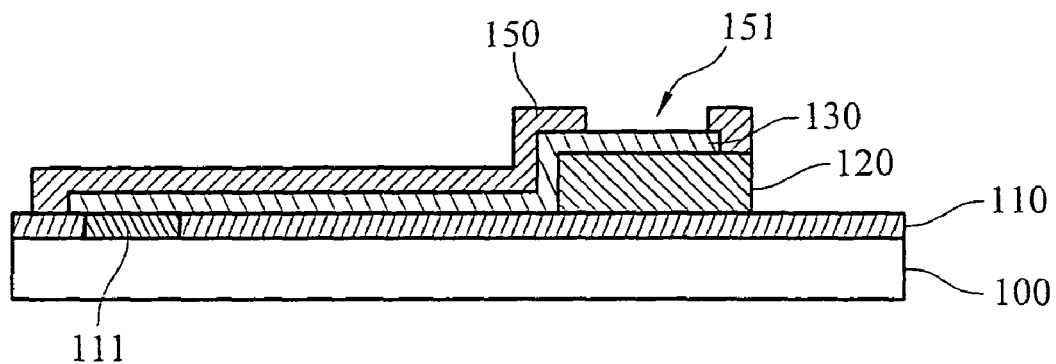
FIGS. 7E and 7F illustrates the fabricating process for the second embodiment of the invention.
Figure 7F:
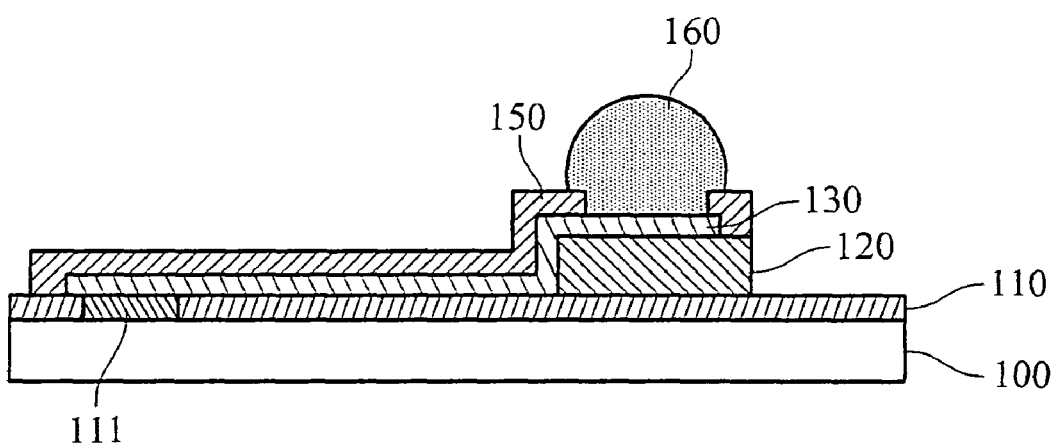

Refer to FIGS. 7E and 7F illustrates the fabricating process for the second embodiment of the invention. The preceding processes are the same as that of the first embodiment. A passivation layer 150 is formed above the metal wire 130. An opening 151 is formed at a position corresponding to the sacrificial layer 120 in the passivation layer 150. A solder ball 160 for metal contact is formed in the space151 to contact with the metal wire 130.

Figure 8:
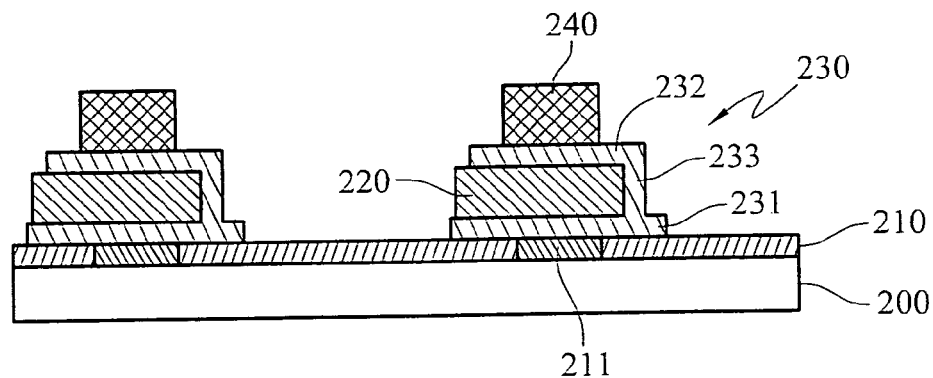
FIG. 8 illustrating the packaging structure according to the third embodiment of the invention.

Refer to FIG. 8 illustrating the packaging structure according to the third embodiment of the invention. The metal wire in this embodiment is different from that in the aforementioned embodiments.

The package structure includes a substrate 200, an insulating layer 210, a sacrificial layer 220, and a metal wire 230. A bump 240 formed on the metal wire 230 is used as a metal contact for electrical connection between the substrate 200 and a PCB (not show). In an exemplary embodiment, the substrate 200 is a Si wafer. In another exemplary embodiment, the substrate 200 is a printed circuit board, or a flexible printed circuit board.

In the embodiment of FIG. 8, the similar structure has similar/same functions to/as the structure of the embodiment of FIG. 5 or FIG. 6. However, the metal wire 230 is different. In this embodiment, the metal wire 230 includes a first metal wire 231, a second metal wire 232 and a connecting metal wire 233 connecting the first metal 231 and the second metal wire 232.

The first metal wire 231 formed on the pad 211. The sacrificial layer 220 is formed on the first metal wire 231. The connecting metal 233 is formed adjacent to one side of the sacrificial layer 220. The second metal wire 232 is formed on the sacrificial layer 220. The bump 240 is formed on the second metal wire 232.

Figure 9:
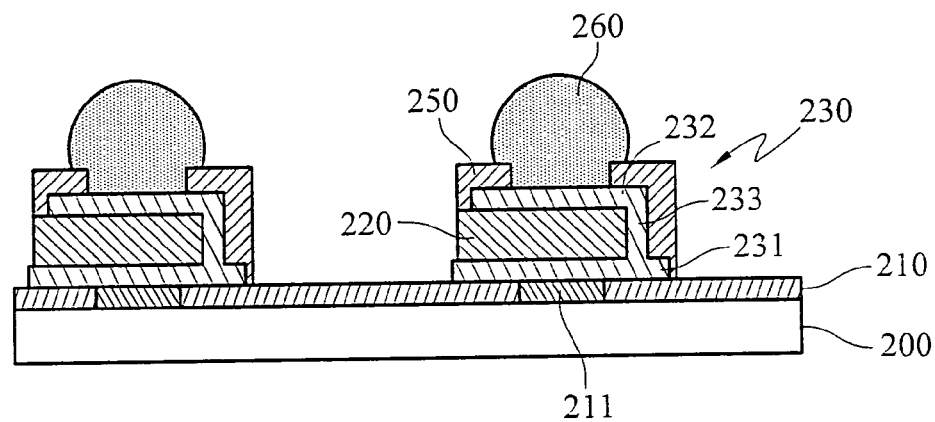
FIG. 9 illustrating the packaging structure according to the forth embodiment of the invention.

Refer to FIG. 9 illustrating the packaging structure according to the forth embodiment of the invention.

In the embodiment of FIG. 9, the similar structure has similar/same functions to/as the structure of the embodiment of FIG. 8. A passivation layer 250 having a space (will be illustrated in the fabricating process as follows) is formed on the second metal wire 232.

In this embodiment, a solder ball 260 used for the metal contact between the substrate 200 and the printed circuit board is formed on the second metal wire 232. The passivation layer 250 is used as for passivation to protect the substrate 200 and the packaging structure from being damaged.

Figure 10:
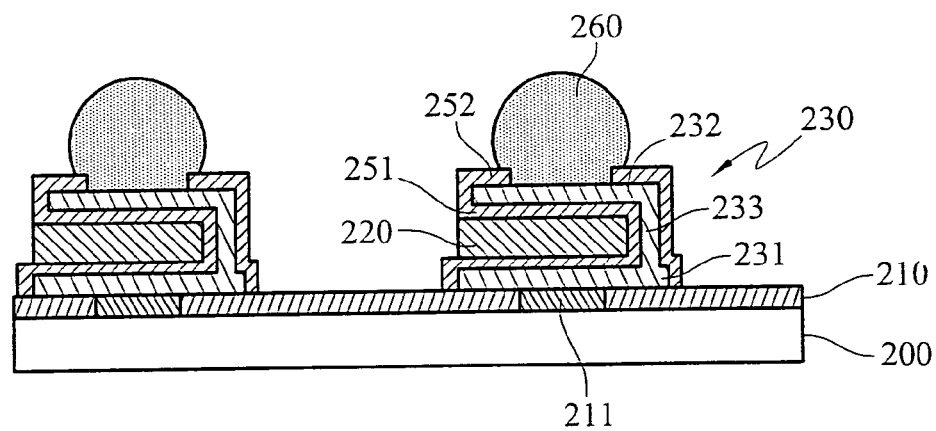
FIG. 10 illustrating the packaging structure according to the fifth embodiment of the invention.

Refer to FIG. 10 illustrating the packaging structure according to the fifth embodiment of the invention. In the embodiment of FIG. 10, the similar structure has similar/same functions to/as the structure of the embodiment of FIG. 8.

A first insulating layer 251 is formed between the sacrificial layer 220 and the metal wire 230. A second insulating layer 252 is formed on the second metal wire 232 and the connecting metal wire 233. The second insulating layer 252 has a space formed at a position corresponding to the sacrificial layer 220. The solder ball 260 is formed in the space of the second insulating layer 252.

The structure in the left portion of the figures is the same as or similar to that in the right portion of the drawing. Only one is illustrated and explained.

Figure 11A:
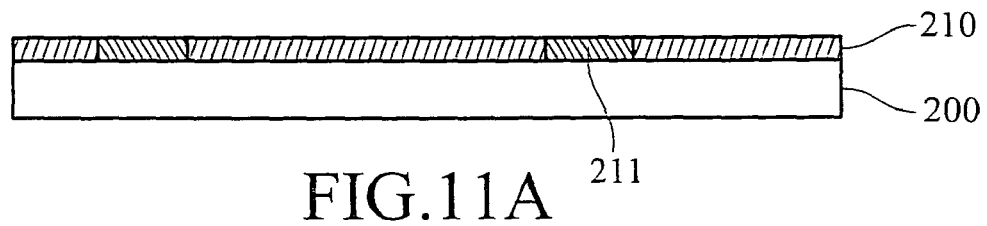
FIG. 11A to 11E illustrates the fabricating process for the third embodiment of the invention.
Figure 11B:
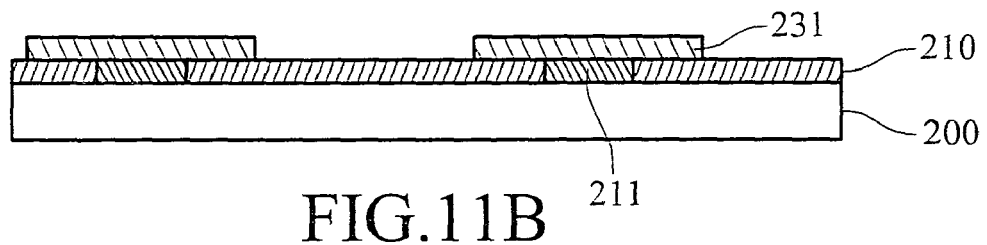
Figure 11C:
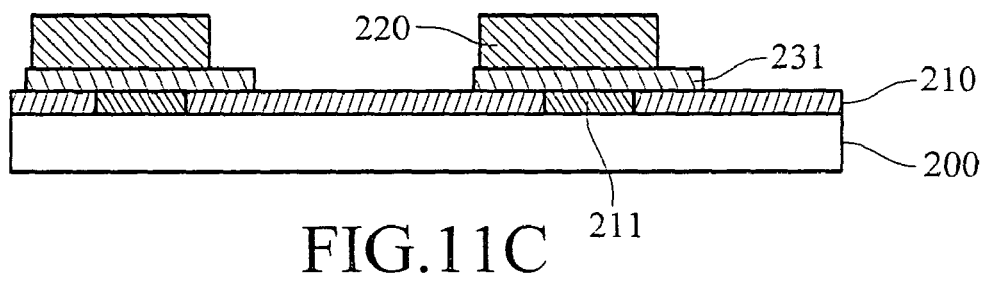

FIG. 11A to 11D illustrates the fabricating process for the third embodiment of the invention. As shown in FIG. 11A, an insulating layer 210 and a plurality of pads 211 (only one pad is given with reference number) are formed on the substrate 200. In one embodiment, the insulating layer 210 is formed first and then a portion is etched to deposit material to form the pads 211. In another embodiment, the pads 211 are formed first and then the insulting layer 210 is deposited on the substrate 200. As shown in FIG. 11B, a plurality of first metal wires 231 are formed on the corresponding pad 211. Then, as shown in FIG. 11C, a plurality of sacrificial layers 220 are formed at the corresponding first metal wire 231.

Figure 11D:
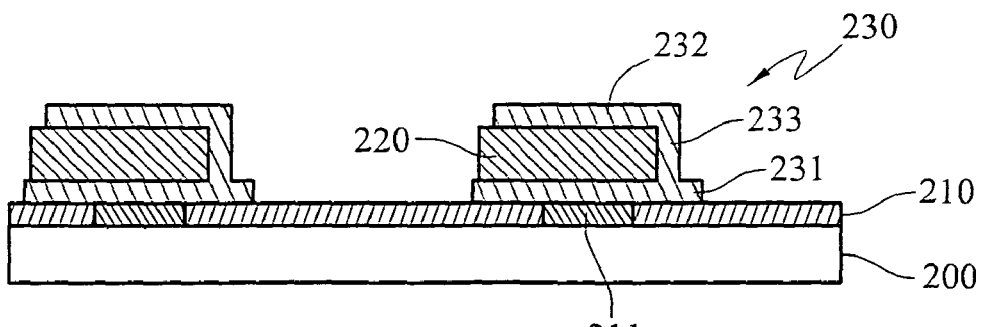
Figure 11E:
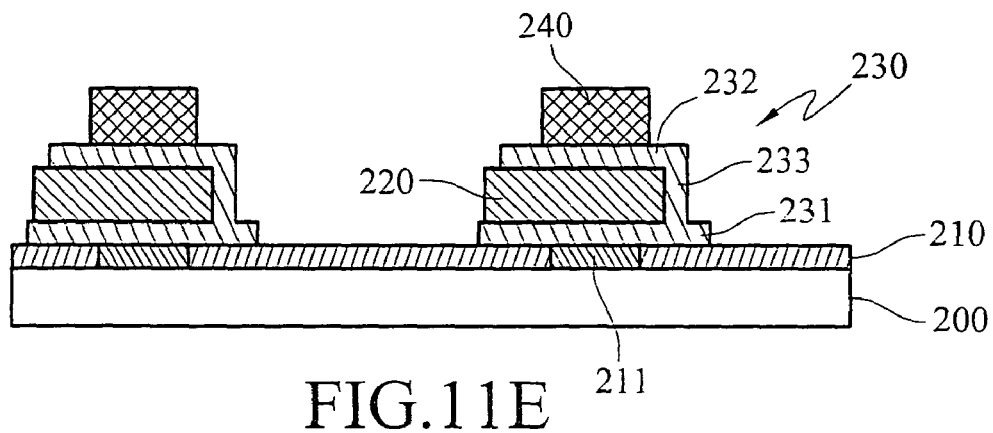

In FIG. 11D, a second metal wire 232 and a connecting metal wire 233 are then formed. Refer to FIG. 11E, a plurality of bumps 240 are formed on the second metal wires 232.

Figure 11F:
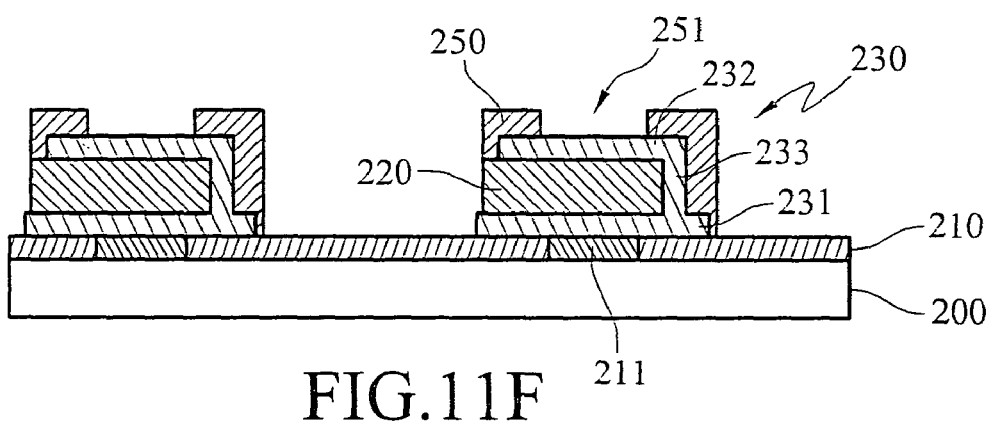
FIGS. 11F and 11G illustrating the fabricating process for the forth embodiment of the invention.
Figure 11G:
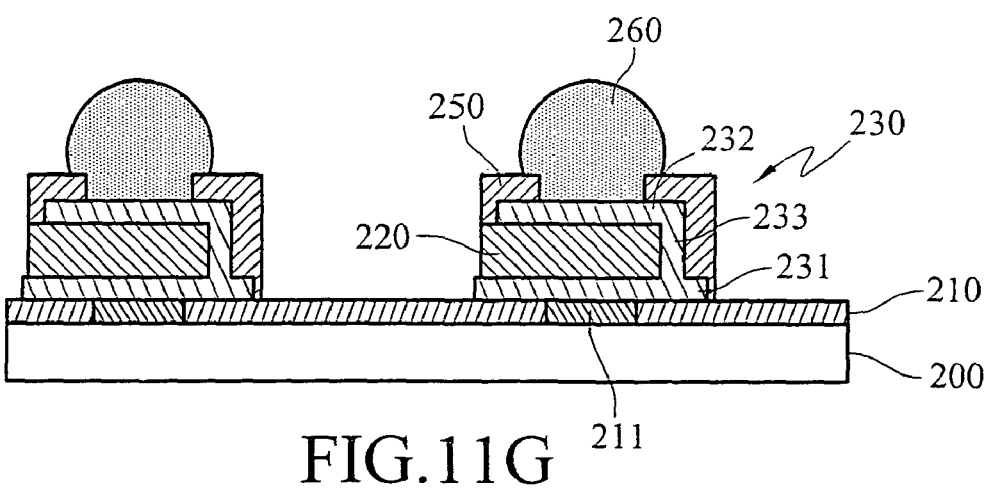

Refer to FIGS. 11F and 11G illustrating the fabricating process for the forth embodiment of the invention. The preceding processes of the forth embodiment are the same as those of the third embodiment and are illustrated in FIGS. 11A to 11G.

A passivation layer 250 is formed above the second metal wire 232. A space 251 is formed at a position corresponding to the sacrificial layer 220 in the passivation layer 250. A solder ball 260 is formed in the space 251 to contact with the second metal wire 232.

Figure 12A:
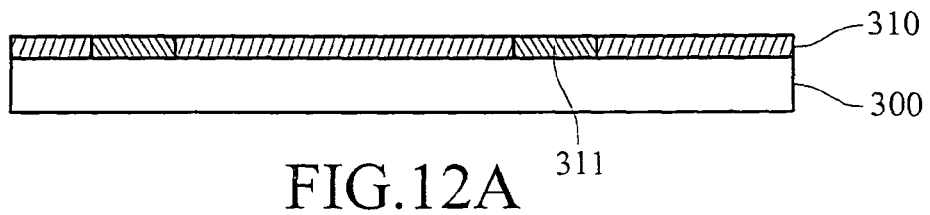
FIGS. 12A to 12H illustrating the manufacturing processes of the fifth embodiment.
Figure 12B:
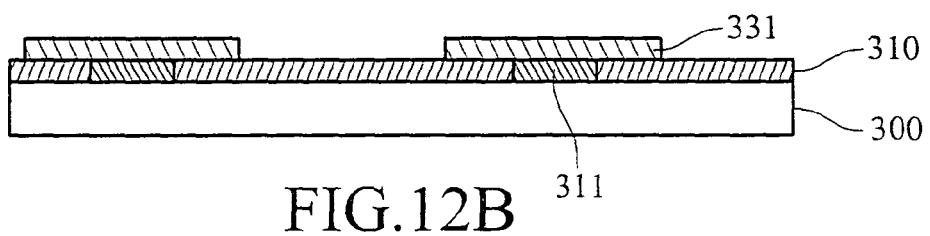

Refer to FIG. 12A to 12H illustrating the manufacturing processes of the fifth embodiment. The preceding processes shown in FIGS. 12A and 12B are the same as the processes of the aforementioned processes in FIGS. 11A and 11B.

Figure 12C:
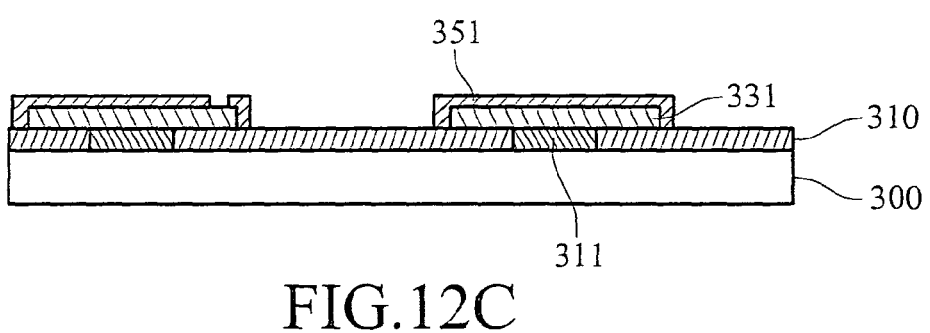

In FIG. 12C, a first insulating layer 351 is formed on the first metal wire 331.

Figure 12D:
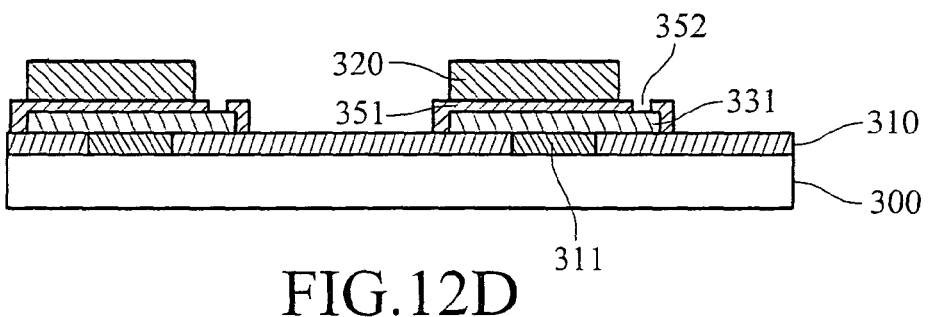
Figure 12E:
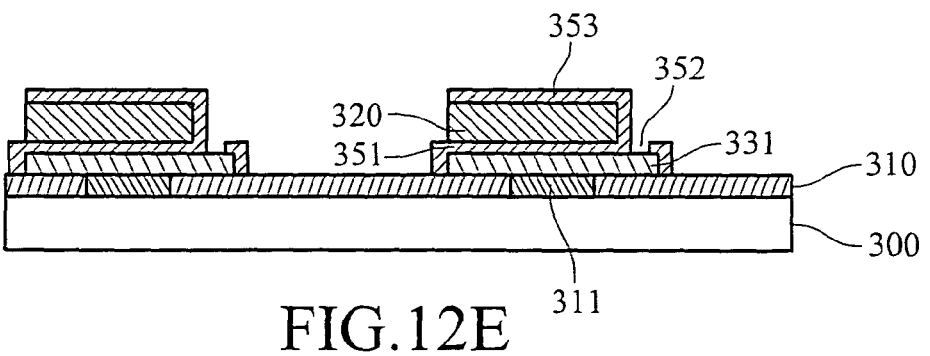

Refer to FIG. 12D. A sacrificial layer 320 is then formed on the first insulating layer 351. Refer to FIG. 12E, a second insulating layer 353 is then deposited on the sacrificial layer 320. A space 352 is also formed in the first insulating layer 351.

Figure 12F:
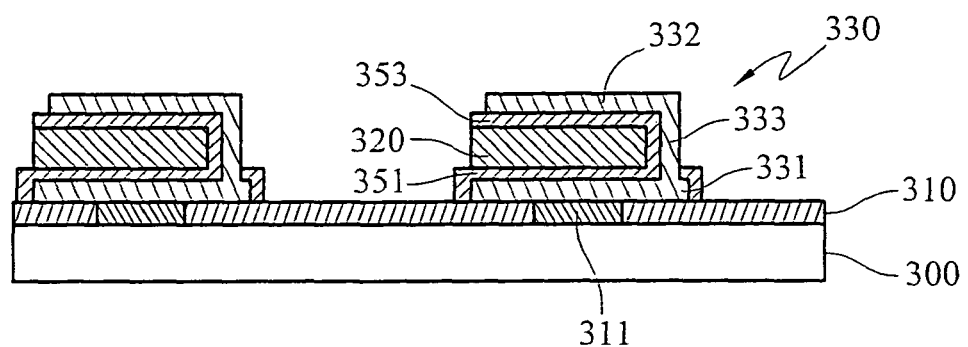
Figure 12G:
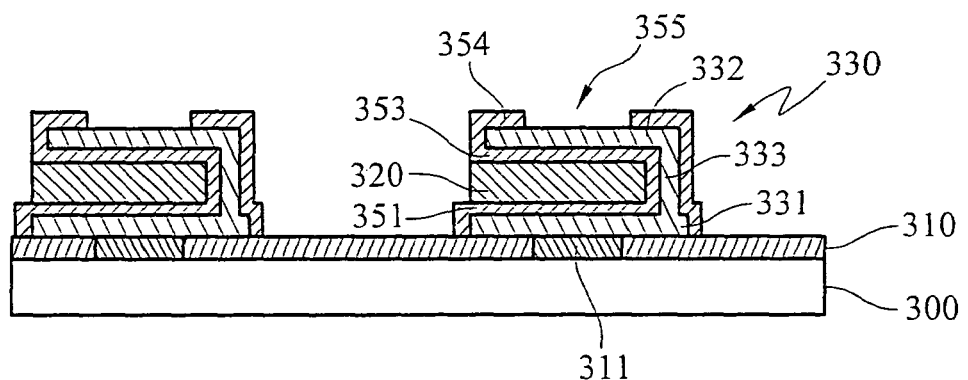
Figure 12H:
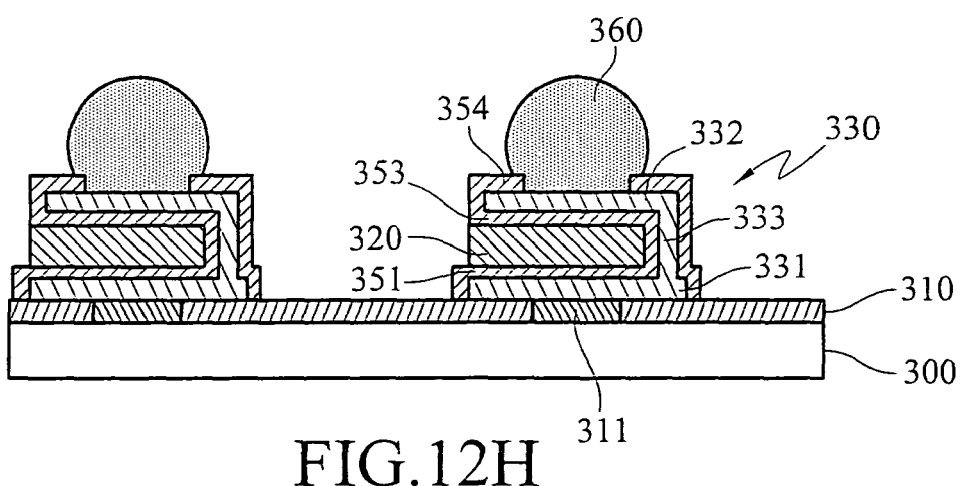

Refer to FIG. 12F to 12H. A second metal wire 332 and a connecting metal wire 333 are formed. A third insulating layer 354 is then formed on the second metal wire 332 and the connecting metal wire 333. A space 355 is formed in the third insulating layer 354. A solder ball 360 is formed in the space 355 to contact with the second metal wire 332.

Refer to FIG. 13A to 13D illustrating another manufacturing process of the third embodiment.

Figure 13A:
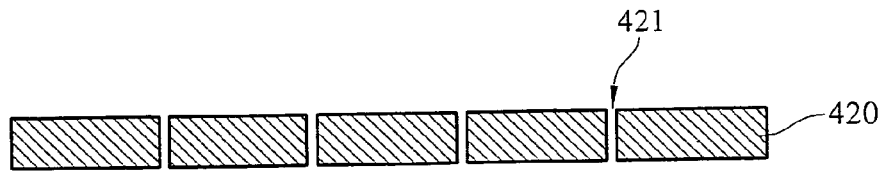
FIGS. 13A to 13E illustrating another manufacturing process of the third embodiment.
Figure 13B:
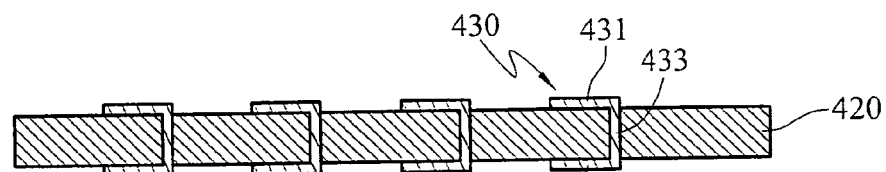

A sacrificial layer 420 with a plurality of through holes 421 is provided, as shown in FIG. 13A. Metal are then deposited in the through holes 421 for formed the connecting metal wire 433 as mentioned above. A plurality of first metal wires 431 and a plurality of second metal wires 432 are formed on the two surfaces of the sacrificial layer 420. Each of the first metal wires 431 and each of the second metal wires 432 connect with one connecting metal wire 433 such that a metal wire for electrical connection between a substrate and a circuit board is formed, as shown in FIG. 13B.

Figure 13C:
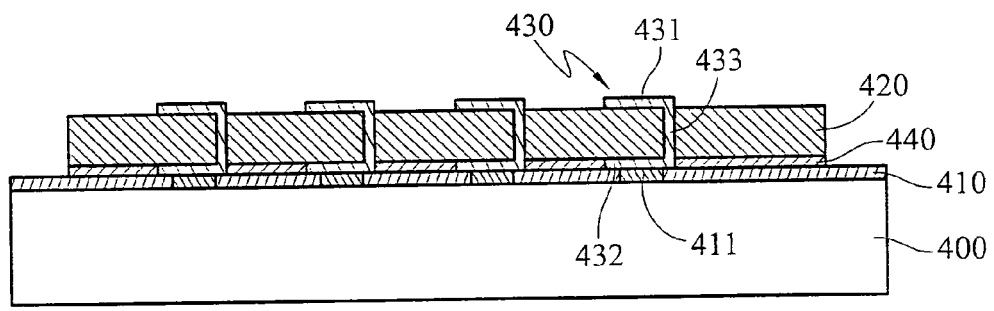

In FIG. 13C, a substrate 400 having an insulating layer 410 formed thereon is provided. In the insulating layer 410, a plurality of pads 411 are formed. The processes for forming the pads are the same as those aforementioned. The sacrificial layer 420 formed with metal wires 430 are bonded together by a bonding layer 440. An anisotropic conductive film (ACF) or a non-conductive film (NCF) may be used for the bonding layer 440.

Figure 13D:
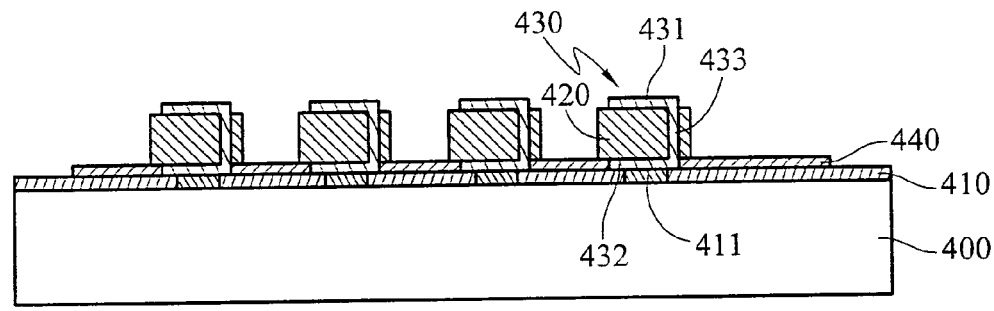
Figure 13E:
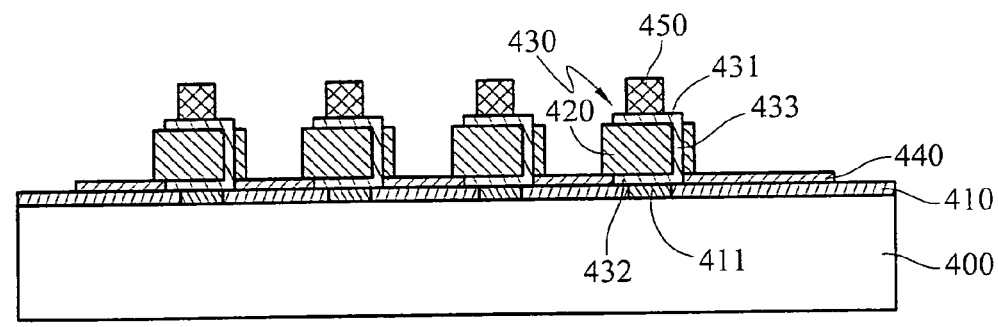

The bonded structures are then insulated by etching to form individual package structures, as illustrated in FIG. 13D. A plurality of bumps 450 for metal contact are formed on the corresponding metal wires, as illustrated in FIG. 13E.

In another embodiment, the plurality of bumps 450 may be formed on the corresponding metal wires before the bonded structures are insulated.

Refer to FIG. 14A to 14D illustrating another manufacturing process of the fourth embodiment.

Figure 14A:
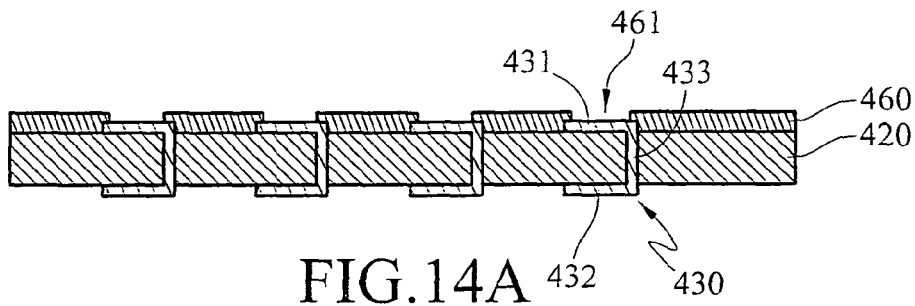
FIGS. 14A to 14D illustrating another manufacturing process of the fourth embodiment.

In FIG. 14A, a sacrificial layer 420 formed with a plurality of metal wires 430 is provided. In one surface of the sacrificial layer 420, an insulating layer 460 is formed. A plurality of spaces 461 are also formed in the insulating layer 460.

Figure 14B:
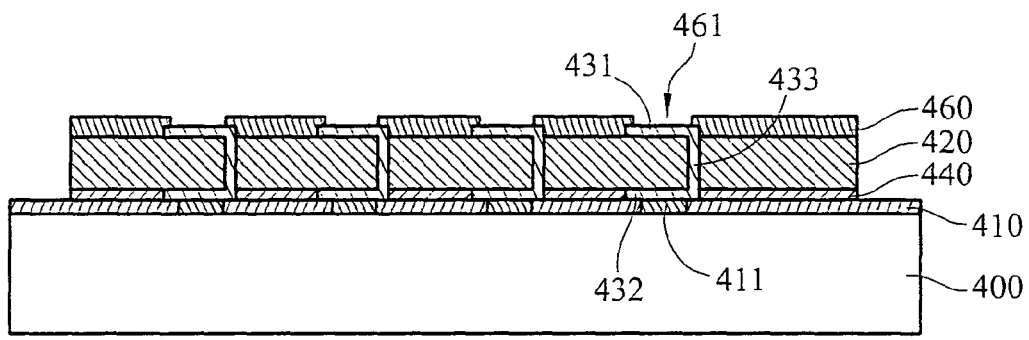
Figure 14C:
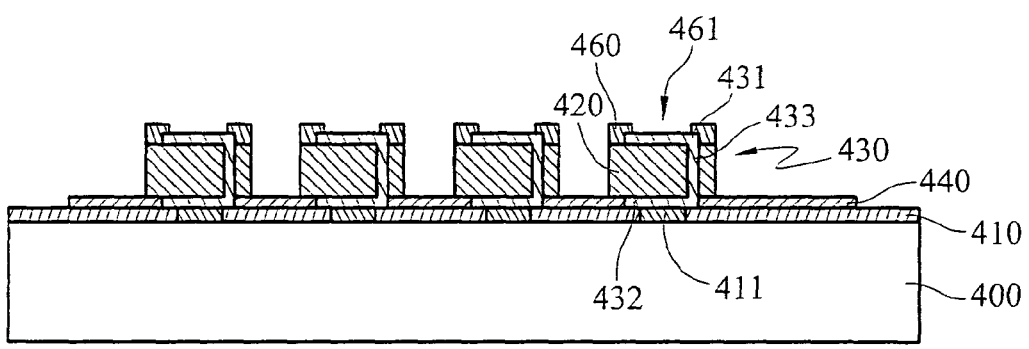
Figure 14D:
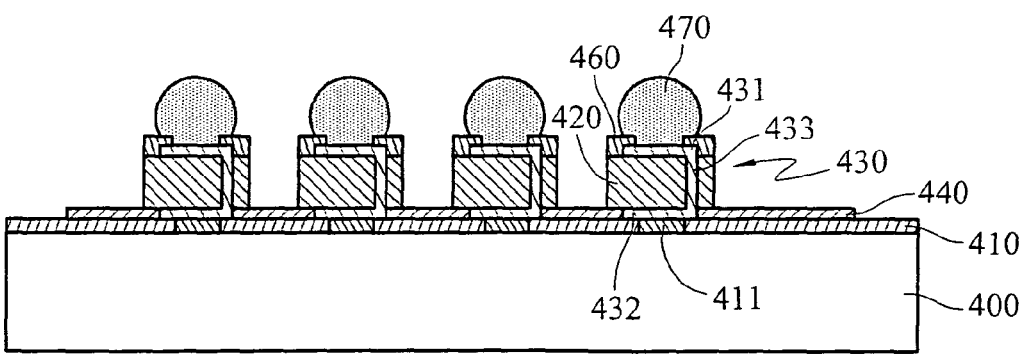

In FIG. 14B, the sacrificial layer 420 formed with metal wires 430 are bonded together by a bonding layer 440. An anisotropic conductive film (ACF) or a non-conductive film (NCF) may be used for the bonding layer 440. in FIG. 14C, the bonded structures are then insulated to form individual package structures. A plurality of solder balls 470 for metal contact are formed on the corresponding metal wires, as illustrated in FIG. 14D.

In another embodiment, the plurality of solder balls 470 may be formed on the corresponding metal wires before the bonded structures are insulated.

Refer to FIG. 15A to 15D illustrating another manufacturing process of the fourth embodiment. The processes in this embodiment are very similar to those in the embodiment in FIG. 14.

Figure 15A:
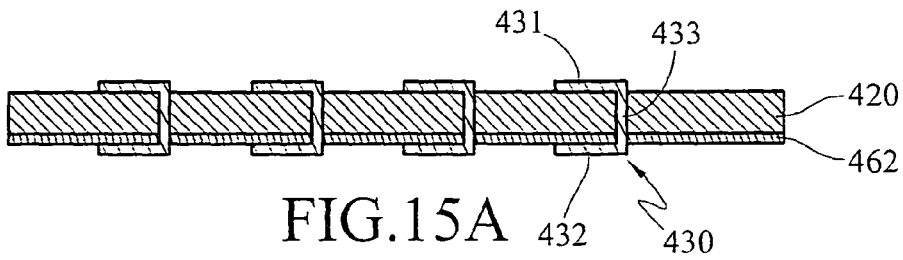
FIG. 15A to 15D illustrating another manufacturing process of the fourth embodiment.

In FIG. 15A, a first insulating layer 462 is formed on one surface of the sacrificial layer 420. A pluralty of metal wires 430 is then formed.

Figure 15B:
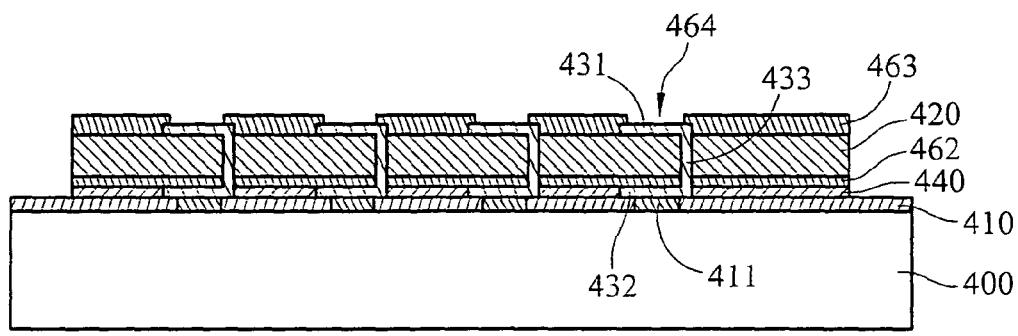

In FIG. 15B, the sacrificial layer 420 formed with metal wires 430 are bonded together by a bonding layer 440. An anisotropic conductive film (ACF) or a non-conductive film (NCF) may be used for the bonding layer 440. The bonding layer 440 bonded the first insulating layer 462 and the insulating layer 410 formed on the substrate 400. A second insulating layer 463 is then formed the other surface of the sacrificial layer 420. A pluralty of spaces 464 are also formed in the second insulating layer 463.

Figure 15C:
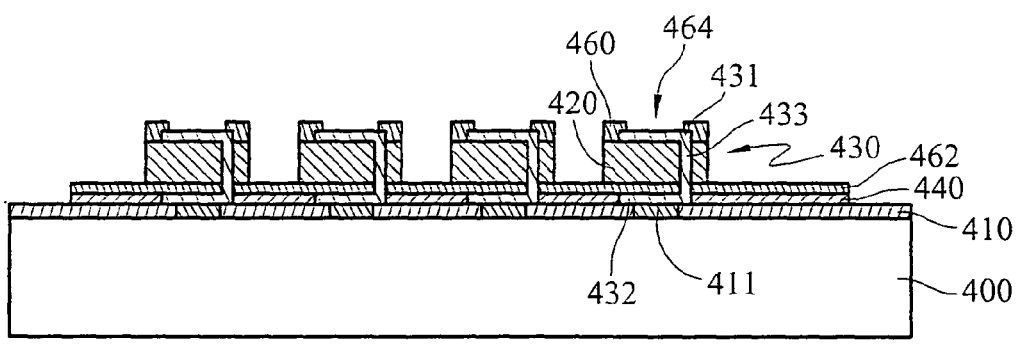
Figure 15D:
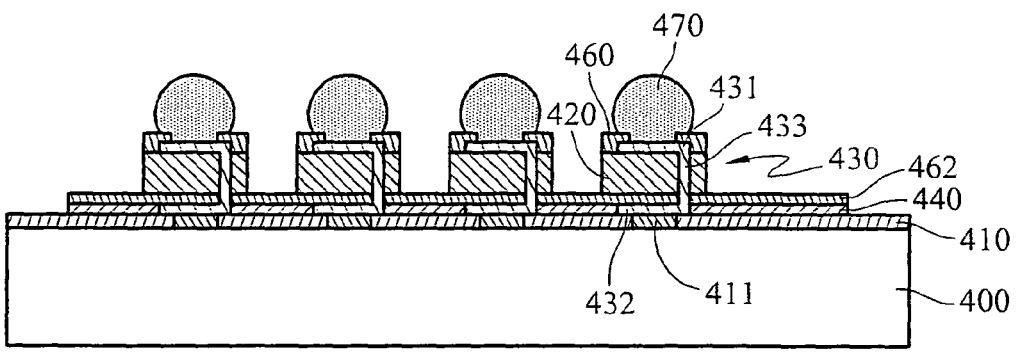

In FIG. 15C, the bonded structures are then insulated to form individual package structures. A plurality of solder balls 470 for metal contact are formed on the corresponding metal wires, as illustrated in FIG. 15D.

In another embodiment, the plurality of solder balls 470 may be formed on the corresponding metal wires before the bonded structures are insulated.

Refer to FIG. 16A to 16F illustrating another manufacturing processes of the fifth embodiment.

Figure 16A:
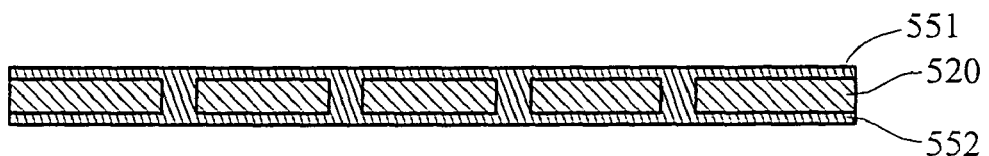
FIG. 16A to 16F illustrating another manufacturing processes of the fifth embodiment.

In FIG. 16A, a sacrificial layer 520 having a first insulating layer 551 and a second insulating 552 is provided. Some portions of the sacrificial layer 520 are also filled with insulating materials. A sacrificial layer 520 with a plurality of through holes (not shown) is provided. Insulated material is then deposited in the through holes, then the first insulating layer 551 and the second insulating 552 are formed on the two surfaces of the sacrificial layer 520.

Figure 16B:
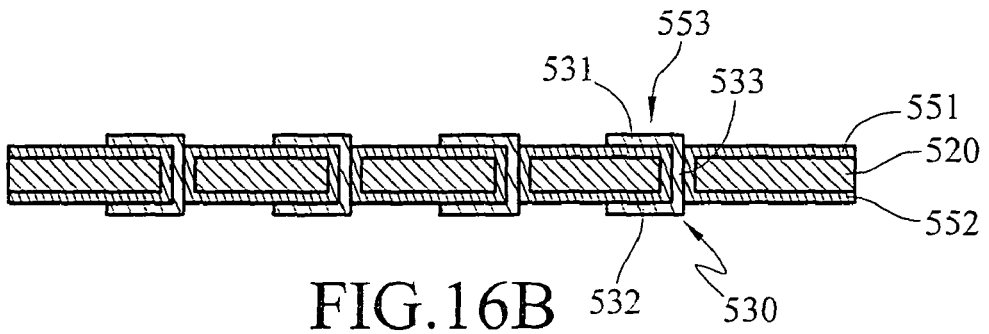

The portions filled with insulating materials are etched to form a plurality of through holes such that connecting metal wires 533 are formed therein, as shown in FIG. 16B. A plurality of first metal wires 531 and a plurality of second metal wires 532 are formed on the surfaces of the first insulating layer 551 and the second insulating layer 552 respectively. Each of the first metal wires 531 and each of the second metal wires 532 connect with one connecting metal wire 533 such that a metal wire for electrical connection between a substrate and a circuit board is formed, as shown in FIG. 16B.

Figure 16C:
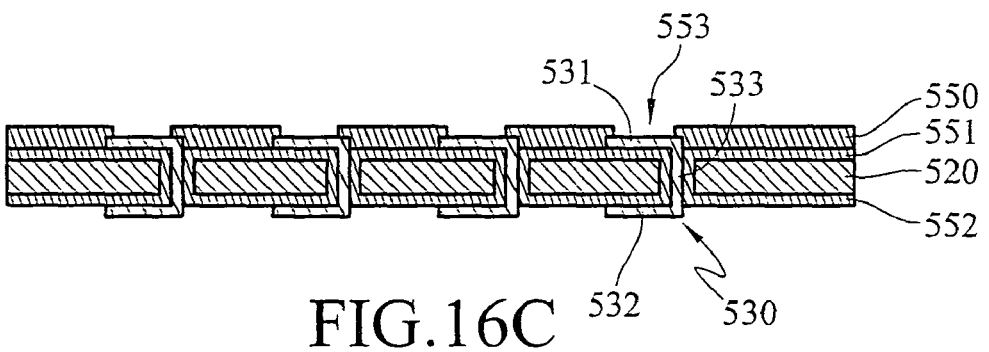
Figure 16D:
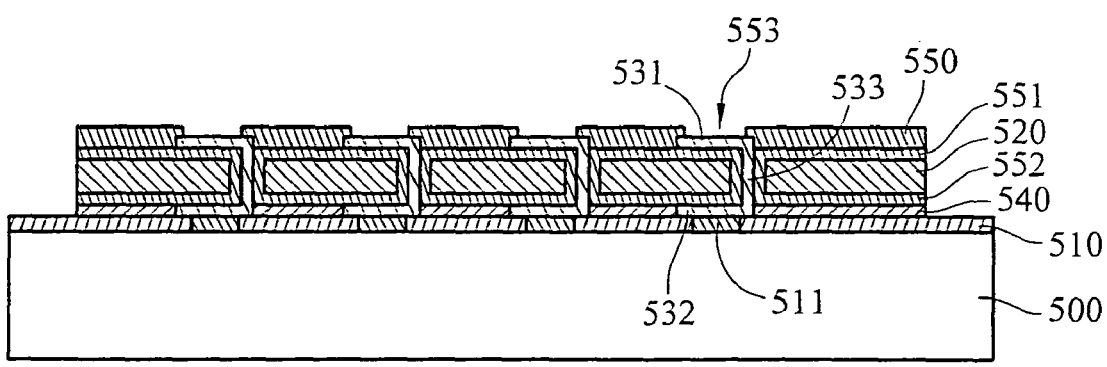

In FIG. 16C, one of the two insulating layers 551, 552 is deposited with a third insulating layer 550 to form a plurality of spaces 553. The other insulating layers that do not have spaces formed thereon are boned with the substrate 500 having a insulating layer 510 formed thereon. The insulating layer 510 has a plurality of pads 511 and each of the pad 511 connects to a corresponding metal wire, as shown in FIG. 16D.

Figure 16E:
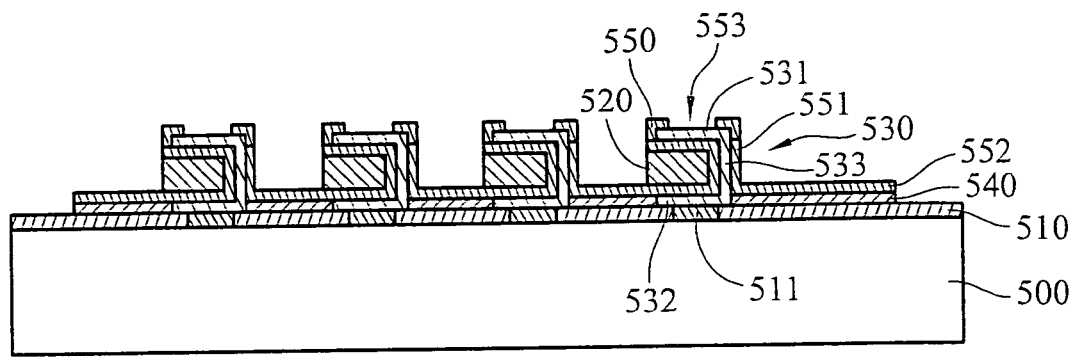
Figure 16F:
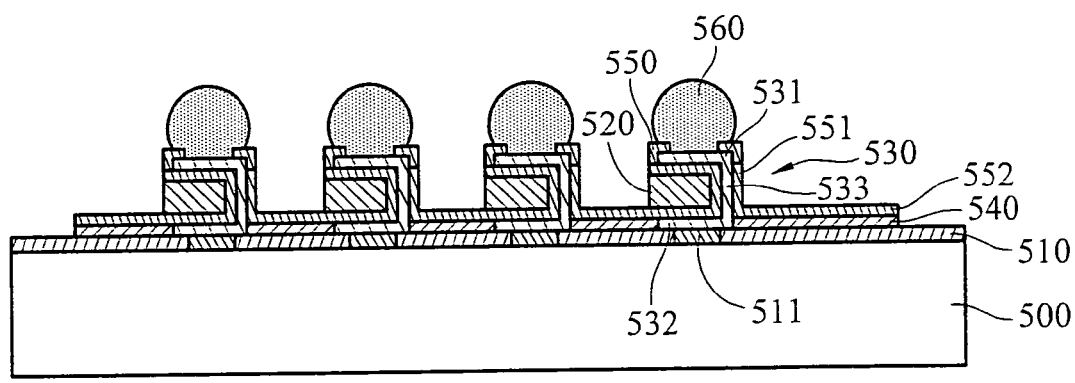

In FIG. 16E, the bonded structures are then insulated to form individual package structures A plurality of solder balls 560 for metal contact are formed on the corresponding metal wires, as illustrated in FIG. 16F.

The invention uses the usual semiconductor process to form a sacrificial layer below the bump using a normal semiconductor process. The interface between the sacrificial layer and the adjacent layers or the sacrificial layer material is the weakest part in the whole structure. When the stress applied to the bump is overloaded, the interface between the sacrificial layer and the PCB or the sacrificial layer material will crash to remove the stress generated by different thermal expansion coefficients of the Si wafer and the PCB. The sacrificial layer can help avoid the crash occurring to the bump to protect the electrical conduction between the Si wafer and the PCB.

Further, when the substrate in the above-mentioned embodiments is a PCB or a flexible PCB, the packaging structure may protect the juncture between the bump and the PCB which contacts with the bump. When the substrate in the above-mentioned embodiments bonds with a PCB or a flexible PCB, the packaging structure may protect the juncture between the substrate and the PCB or the flexible PCB The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:
1. A packaging structure comprising:
a substrate;

an insulating layer formed on the substrate, wherein the insulating layer has a pad formed therein;
a first metal wire formed on the pad;
a sacrificial layer formed on the first metal wire, the sacrificial layer having a first side and a second side, the first side being exposed to air;
a second metal wire formed on the sacrificial layer; and
a connecting metal wire formed at the second side of the sacrificial layer to connect with the first metal wire and the second metal wire; and
a bump formed on the second metal wire,
wherein an entire bottom surface of the bump is directly above the sacrificial layer, the entire pad is directly below the sacrificial layer, and the bump is directly above the pad.

2. The packaging structure of claim 1 further comprises:
a passivation layer formed on the second metal wire, wherein the passivation layer has a space formed at a position corresponding to the sacrificial layer; and
wherein the bump is formed in the space of the passivation layer.

3. The packaging structure of claim 1 further comprises:
a first insulating layer formed between the sacrificial layer and the first metal wire;
a second insulating layer formed on the second metal wire and the connecting metal wire, wherein the second insulating layer has a space formed at a position corresponding to the sacrificial layer; and
wherein the bump is formed in the space of the second insulating layer.

4. The packaging structure of claim 1, wherein the material of the sacrificial layer is selected from the group consisting of metals, epoxy, organic polymers, and inorganic oxides.

5. The packaging structure of claim 1, further comprising:
a first insulating layer, formed on the first metal wire;
a second insulating layer, formed on the sacrificial layer; and
a third insulating layer, formed on the second metal wire and the connecting metal wire.

6. The packaging structure of claim 1, wherein a stress applied to the bump is overloaded, the sacrificial layer material is crash to remove the stress.

7. The packaging structure of claim 1, wherein a material of the sacrificial layer has the weakest mechanical strength in the packaging structure.

* * * * *